(12) United States Patent
Pilo et al.

(10) Patent No.: US 12,112,818 B2
(45) Date of Patent: Oct. 8, 2024

(54) SCAN CHAIN COMPRESSION FOR TESTING MEMORY OF A SYSTEM ON A CHIP

(71) Applicant: Synopsys, Inc., Mountain View, CA (US)

(72) Inventors: Harold Pilo, Underhill, VT (US); Shishir Kumar, Uttar Pradesh (IN)

(73) Assignee: Synopsys, Inc., Sunnyvale, CA (US)

( * ) Notice: Subject to any disclaimer, the term of this patent is extended or adjusted under 35 U.S.C. 154(b) by 164 days.

(21) Appl. No.: 17/856,744

(22) Filed: Jul. 1, 2022

(65) Prior Publication Data

US 2023/0005562 A1    Jan. 5, 2023

(30) Foreign Application Priority Data

Jul. 5, 2021   (IN) .............................. 202141030110

(51) Int. Cl.
| | |
|---|---|
| *G11C 7/00* | (2006.01) |
| *G11C 29/30* | (2006.01) |
| *G11C 29/40* | (2006.01) |
| *G11C 29/32* | (2006.01) |

(52) U.S. Cl.
CPC .............. *G11C 29/40* (2013.01); *G11C 29/30* (2013.01); *G11C 2029/3202* (2013.01)

(58) Field of Classification Search
CPC .. G11C 29/40; G11C 29/30; G11C 2029/3202
USPC ...................................................... 365/201
See application file for complete search history.

(56) References Cited

U.S. PATENT DOCUMENTS

| | | | | |
|---|---|---|---|---|
| 5,557,619 | A * | 9/1996 | Rapoport | G11C 29/18 |
| | | | | 714/719 |
| 5,996,097 | A * | 11/1999 | Evans | G11C 29/26 |
| | | | | 365/201 |
| 6,795,948 | B2 * | 9/2004 | Lin | G01R 31/318547 |
| | | | | 716/136 |
| 7,908,532 | B2 * | 3/2011 | Eckelman | G01R 31/318544 |
| | | | | 714/734 |
| 8,028,209 | B2 * | 9/2011 | Li | G06F 11/2733 |
| | | | | 714/724 |
| 8,621,302 | B2 * | 12/2013 | Whetsel | G01R 31/318544 |
| | | | | 714/733 |
| 9,666,302 | B1 * | 5/2017 | Chang | G11C 29/54 |
| 9,947,419 | B1 * | 4/2018 | Sinha | G11C 29/02 |
| 10,459,031 | B2 * | 10/2019 | Gloekler | G01R 31/318544 |
| 10,593,420 | B2 * | 3/2020 | Barowski | G11C 15/00 |

(Continued)

*Primary Examiner* — Viet Q Nguyen
(74) *Attorney, Agent, or Firm* — Andrew L. Dunlap; Haynes Beffel & Wolfeld LLP

(57) ABSTRACT

A method of using on-chip circuitry to test a memory of a chip is provided. The method including, in a capture stage, receiving, at a first n-bit compression structure including n first stage latches corresponding to each bit of the first n-bit compression structure, a value at each respective first stage latch for each of n memory addresses of the memory, such that each respective first stage latch receives a respective value from a memory address of the memory, n being an integer greater than one, and in the capture stage, passing the values from each respective first stage latch through compression logic of the first n-bit compression structure to output a single compressed address value, providing the single compressed address value to a second stage latch of the first n-bit compression structure.

20 Claims, 7 Drawing Sheets

(56) References Cited

U.S. PATENT DOCUMENTS

| | | | |
|---|---|---|---|
| 10,802,077 B1* | 10/2020 | Srinivasan | G11C 29/32 |
| 11,599,098 B2* | 3/2023 | Wentz | G01R 31/317 |
| 2023/0092349 A1* | 3/2023 | Lo | G11C 29/40 |
| | | | 714/726 |

* cited by examiner

SCAN CHAIN COMPRESSION FOR TESTING MEMORY OF A SYSTEM ON A CHIP

RELATED APPLICATION

This application claims priority to IN Provisional Application No. 202141030110, filed on 5 Jul. 2021 and titled SCAN CHAIN COMPRESSION FOR DESIGN FOR TEST MEMORY TESTING OF A SYSTEM ON A CHIP, which is incorporated herein.

TECHNICAL FIELD

The present disclosure relates to testing memory of a chip, and more specifically relates to testing the memory of a system on a chip (SoC).

BACKGROUND

System on a chip (SoC) testing algorithms require different intellectual property (IP) components (ex. memory blocks) to be tested. A significant portion of the testing algorithms test the interconnection between the memory blocks and memory interface components to ensure proper connectivity, to ensure that there are no open circuit or short circuits across the memory interface and to ensure that there are no stuck-at logic faults (e.g., permanently grounded, permanently shorted or unconnected nets). The memory components of the SoC can include a design for test (DFT) feature that is used to capture inputs from a memory into a scan chain that can be serially scanned out for the observability of the memory interface. This DFT feature can include primary/secondary latches and input multiplexers, as well as logic that is stored in the memory.

SUMMARY

The present disclosure provides method of using on-chip circuitry to test a memory of a chip. The method can include in a capture stage, receiving, at a first n-bit compression structure including n first stage latches corresponding to each bit of the first n-bit compression structure, a value at each respective first stage latch for each of n memory addresses of the memory of the chip, such that each respective first stage latch receives a respective value from a memory address of the memory, n being an integer greater than one. The method can further include in the capture stage, passing the values from each respective first stage latch through compression logic of the first n-bit compression structure to output a single compressed address value, providing the single compressed address value to a second stage latch of the first n-bit compression structure. Additionally, the method can include in a testing stage, comparing the value of the second stage latch of the first n-bit compression structure, as output from the first n-bit compression structure, to a known correct value to determine whether an interface to the memory is operating as desired.

Furthermore, in an embodiment, n can have a value of two. In another embodiment, n can have a value of four.

In a further embodiment, the four-bit compression structure can include a first NOR gate connected to outputs of a first two of four first stage latches, a second NOR gate connected to outputs of a second two of the four first stage latches, a NAND gate having inputs connected to outputs of the first and second NOR gates, and a first multiplexer connected to an output of the NAND gate. Further, the method can include in the capture stage, passing the values from the first two of the four first stage latches to inputs of the first NOR gate, in the capture stage, passing the values from the second two of the four first stage latches to inputs of the second NOR gate, and in the capture stage passing an output of the NAND gate as the single compressed address value to the first multiplexer.

In an embodiment, the method can include, in the capture stage for capturing a value of a particular latch of the four first stage latches, setting values of the remaining three latches of the four first stage latches to 0, such that the output of the NAND gate, which is the single compressed address value, matches the value of the particular latch, the particular latch being connected to a particular memory address of the memory, and in the testing stage for testing an interface to the particular memory address of the memory, comparing the value of the second stage latch of the four-bit compression structure, as output from the four-bit compression structure, to a known correct value of the particular memory address to determine whether the interface to the particular memory address is operating as desired.

In another embodiment, the method can include in the capture stage, passing the single compressed address value from the first multiplexer to the second stage latch, switching from the capture stage to a scan stage based on another input into the first multiplexer, and after switching from the capture stage to the scan stage passing a value received on the other input into the first multiplexer to the second stage latch.

In a further embodiment, the method can further include after switching from the capture stage to the scan stage, passing the previously stored single compressed address value from the second stage latch to a latch of a second four-bit compression structure.

In an embodiment, the method can further include switching from the capture stage to the scan stage in dependence upon a scan enable (SE) signal of the chip.

In another embodiment, the four-bit compression structure can include a first NAND gate connected to outputs of a first two of four first stage latches, a second NAND gate connected to outputs of a second two of the four first stage latches, a NOR gate having inputs connected to outputs of the first and second NAND gates, and a first multiplexer connected to an output of the NOR gate. Further, the method can include in the capture stage, passing the values from the first two of the four first stage latches to inputs of the first NAND gate, in the capture stage, passing the values from the second two of the four first stage latches to inputs of the second NAND gate, and in the capture stage passing an output of the NOR gate as the single compressed address value to the first multiplexer.

In an embodiment, the method can further include in the capture stage for capturing a value of a particular latch of the four first stage latches, setting values of the remaining three latches of the four first stage latches to 1, such that the output of the NOR gate, which is the single compressed address value, matches the value of the particular latch, the particular latch being connected to a particular memory address of the memory, and in the testing stage for testing an interface to the particular memory address of the memory, comparing the value of the second stage latch of the four-bit compression structure, as output from the four-bit compression structure, to a known correct value of the particular memory address to determine whether the interface to the particular memory address is operating as desired.

In another embodiment, the four-bit compression structure can include a first XOR gate connected to outputs of a_ first two of four first stage latches, a second XOR gate connected to outputs of a second two of the four first stage latches, a NAND gate having inputs connected to outputs of the first and second XOR gates, and a first multiplexer connected to an output of the XOR gate. Further, the method can include in the capture stage, passing the values from the first two of the four first stage latches to inputs of the first XOR gate, in the capture stage, passing the values from the second two of the four first stage latches to inputs of the second XOR gate, and in the capture stage passing an output of the NAND gate as the single compressed address value to the first multiplexer.

In a further embodiment, in the capture stage for capturing a value of a particular latch of the four first stage latches, setting values of the remaining three latches of the four first stage latches to 1, such that the output of the NOR gate, which is the single compressed address value, matches the value of the particular latch, the particular latch being connected to a particular memory address of the memory, and in the testing stage for testing an interface to the particular memory address of the memory, comparing the value of the second stage latch of the four-bit compression structure, which is the value of the particular latch, to a known correct value of the particular memory address to determine whether the interface to the particular memory address is operating as desired.

In an embodiment, the four-bit compression structure can include a first XOR gate connected to outputs of a first two of four first stage latches, a second XOR gate connected to outputs of a second two of the four first stage latches, a NAND gate having inputs connected to outputs of the first and second XOR gates, and a first multiplexer connected to an output of the XOR gate. Further, the method can include in the capture stage, passing the values from the first two of the four first stage latches to inputs of the first XOR gate, in the capture stage, passing the values from the second two of the four first stage latches to inputs of the second XOR gate, and in the capture stage passing an output of the NAND gate as the single compressed address value to the first multiplexer.

In another embodiment, the four-bit compression structure can include a first multiplexer connected to a first latch of four first stage latches, the first multiplexer receiving (i) a first input as a scan in (SI) signal, (ii) a second input as a value of a first memory address of the memory and (iii) a third input as a scan enable (SE) signal that dictates whether the first four-bit compression structure is in the capture stage or the scan stage, a first OR gate connected to a second latch of the four first stage latches, the first OR gate receiving (i) a first input as the SE signal that controls operation of the first multiplexer and (ii) a second input as a value of a second memory address of the memory, a second OR gate connected to a third latch of the four first stage latches, the second OR gate receiving (i) a first input as the SE signal that controls operation of the first multiplexer and (ii) a second input as a value of a third memory address of the memory, and a third OR gate connected to a fourth latch of the four first stage latches, the third OR gate receiving (i) a first input as the SE signal that controls operation of the first multiplexer and (ii) a second input as a value of a fourth memory address of the memory.

In a further embodiment, the four-bit compression structure can include a fourth NOR gate connected to outputs of a first two of the four first stage latches, a fifth NOR gate connected to outputs of a second two of the four first stage latches, and a NAND gate having inputs connected to outputs of the fourth and fifth NOR gates. Further, the method can include in the capture stage, passing the values from the first two of the four first stage latches to inputs of the fourth NOR gate, in the capture stage, passing the values from the second two of the four first stage latches to inputs of the fifth NOR gate, and in the capture stage passing an output of the NAND gate as the single compressed address value to the second stage latch.

In another embodiment, the four-bit compression structure can include a first NAND gate connected to outputs of a first two of the four first stage latches, a second NAND gate connected to outputs of a second two of the four first stage latches, and a fourth NOR gate having inputs connected to outputs of the first and second NAND gates. Further, the method can include, in the capture stage, passing the values from the first two of the four first stage latches to inputs of the first NAND gate, in the capture stage, passing the values from the second two of the four first stage latches to inputs of the second NAND gate, and in the capture stage passing an output of the fourth NOR gate as the single compressed address value to the second stage latch.

In an embodiment, the four-bit compression structure can include a first XOR gate connected to outputs of a first two of the four first stage latches, a second XOR gate connected to outputs of a second two of the four first stage latches, and a NAND gate having inputs connected to outputs of the first and second XOR gates. Further, the method can include in the capture stage, passing the values from the first two of the four first stage latches to inputs of the first XOR gate, in the capture stage, passing the values from the second two of the four first stage latches to inputs of the second XOR gate, and in the capture stage passing an output of the NAND gate as the single compressed address value to the second stage latch.

In a further embodiment, the method can include in a scan stage, passing the value of the second stage latch of the first n-bit compression structure to a latch of a second n-bit compression structure, and in the capture stage, receiving, at the second n-bit compression structure including n first stage latches corresponding to each bit of the second n-bit compression structure, a value at each respective first stage latch for each of n memory addresses of the memory, such that each respective first stage latch, of the second n-bit compression structure, receives a respective value from a memory address of the memory, n being an integer greater than one.

In another embodiment, the method can include, in the testing stage, comparing the value of the second stage latch of the second n-bit compression structure to a known correct value to determine whether the memory is operating as desired.

In an embodiment, wherein the n first stage latches are part of a functional path of the memory.

In a further embodiment a system for testing a memory of a chip is provided The system can include a first n-bit compression structure including n first stage latches corresponding to each bit of the first n-bit compression structure, the first n-bit compression structure being configured to receive, in a capture stage, a value at each respective first stage latch for each of n memory addresses of the memory, such that each respective first stage latch receives a respective value from a memory address of the memory, n being an integer greater than one. The first n-bit compression structure can further include compression logic and a second stage latch, such that, in the capture stage, the values pare passed from each respective first stage latch through the compression logic to output a single compressed address value and the single compressed address value is provided to the second stage latch. The system can further include testing logic configured to, in a testing stage, compare the value of the second stage latch of the first n-bit compression structure, as output from the first n-bit compression structure, to a known correct value to determine whether an interface to the memory is operating as desired (correctly). The system can include any of the above-described structure discussed above with respect to the method.

In another embodiment a non-transitory computer readable medium is provided. The non-transitory computer readable medium can include stored instructions for testing a memory of a chip, the instructions, when executed by a processor, causing the processor to perform various operations. The operations can include in a capture stage, receiving, at a first n-bit compression structure including n first stage latches corresponding to each bit of the first n-bit compression structure, a value at each respective first stage latch for each of n memory addresses of the memory, such that each respective first stage latch receives a respective value from a memory address of the memory, n being an integer greater than one, in the capture stage, passing the values from each respective first stage latch through compression logic of the first n-bit compression structure to output a single compressed address value, providing the single compressed address value to a second stage latch of the first n-bit compression structure, and in a testing stage, comparing the value of the second stage latch of the first n-bit compression structure, as output from the first n-bit compression structure, to a known correct value to determine whether the memory is operating as desired.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to scan chain compression for testing memory of chip.

SoC testing algorithms require different intellectual property (IP) components (ex. memory blocks) to be tested. A significant portion of the testing algorithms test the interconnection between the memory blocks and memory interface components to ensure proper connectivity, to ensure that there are no open circuit or short circuits across the memory interface and to ensure that there are no stuck-at logic faults (e.g., permanently grounded, permanently shorted or open memory interface connections). The memory components of the SoC can include a design for test (DFT)) feature that is used to capture inputs from a memory into a scan chain that can be serially scanned out for the observability of the memory interface. A scan chain may be a series of flip-flops (also referred to as flops herein) or latches that store values read out of the memory being tested and then provide the stored values as an output that is compared to an expected output. This DFT feature can include primary/secondary latches, input multiplexers and logic. These components can take up a significant percentage of the overall area of the memory of the SoC, and even more so for a memory that has a smaller word count. A memory can be considered as having a smaller word count if it has a word count between 8 and 256. When the word count is smaller, the components that implement the DFT feature will take up a large overall percentage of the area that is available for the memory of the SoC, increasing the overall area of the SoC. Furthermore, the DFT feature incurs additional wiring complexities on the SoC and additional clock cycles are taken up to control inputs to the memory and to progress through capture and scan stages.

The present disclosure describes a significant simplification of on-chip circuitry (i.e., built-in circuitry of a SoC for testing the IP components of the SoC) that reduces the area taken up by the on-chip circuitry by four times or more and eliminates the above-mentioned setup time constraints (penalties), which greatly reduce the overhead for implementing the DFT feature on the SoC.

Figure 1:
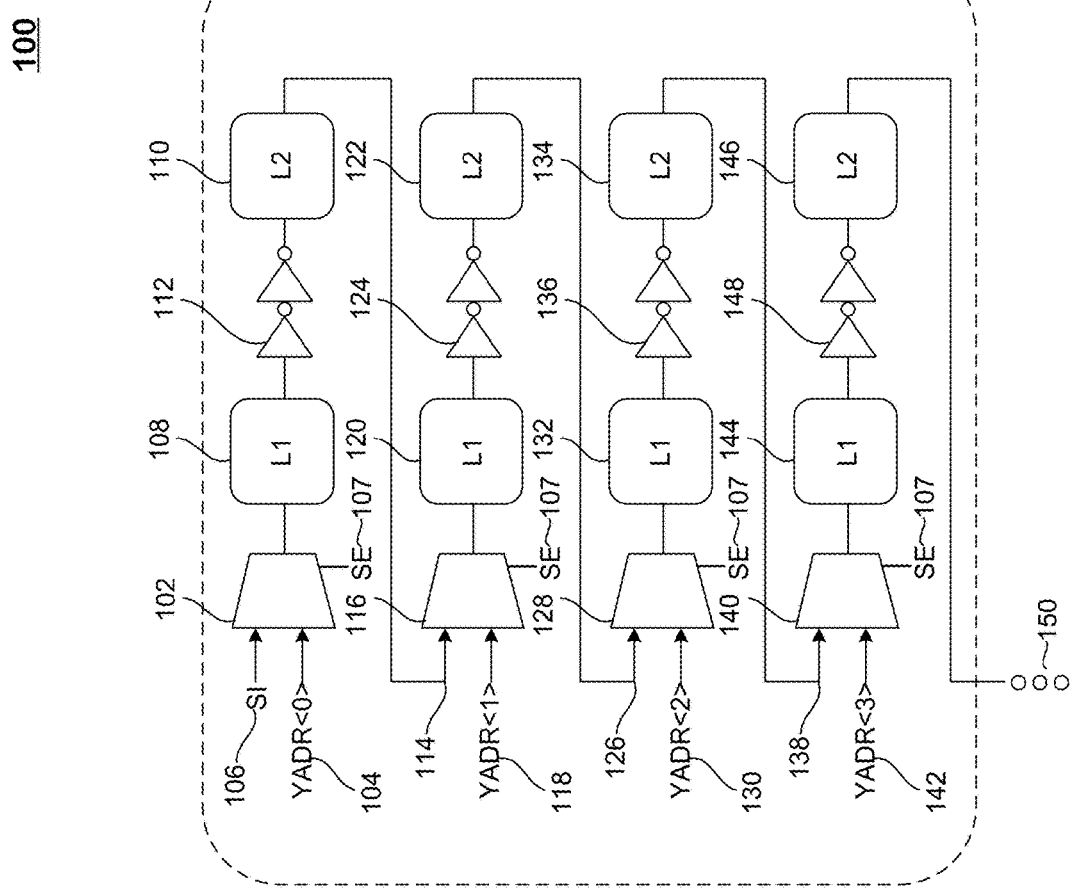
FIG. 1 illustrates a block diagram of an approach of using DFT observation logic to test a memory of an SoC, according to an embodiment of the present disclosure.

FIG. 1 illustrates a block diagram of an approach of using DFT observation logic. Specifically, DFT observation logic 100 includes a scan chain with each input (from a memory) being received by input multiplexing (i.e., multiplexers) and then captured into a latch (or a flop). The input multiplexing can choose between a capture function, which captures values from addresses of the memory to be tested, and a scan function, which outputs the captured values in series in a signal that is compared to expected results. A flop may include a shared primary device (e.g., latch L1) which is part of a functional path and a secondary device (e.g., latch L2), which is part of a capture/scan-chain path. The functional path is a path used for ordinary use of the memory and the capture/scan-chain path is a path used for testing the memory. A significant amount of logic overhead is incurred by each input having its own multiplexer, flop (e.g., shared primary latch L1 and secondary latch L2), and logic.

Specifically, FIG. 1 illustrates that the scan chain includes a first multiplexer 102 that receives a value from a first memory address YADR<0> 104. The value of the first memory address YADR<0> 104 can be received from an interface connected to the memory. The DFT observation logic 100 can be used to check the behavior of the interface of the memory that connects the memory to the scan chain to the memory. The multiplexer 102 also receives a serial enable (SE) signal 107 and a scan in (SI) signal 106. The SE signal 107 controls the output of the multiplexer 102, so as to output either the SI signal 106 or the value of the first memory address YADR<0> 104. The SE signal 107 dictates whether the scan chain is in the capture stage of capturing data from the memory or in a scan stage of shifting values out of the scan chain (so that the values received from the memory can be output for testing and so that SI signal 106 can be input into the scan chain. Further, the output of the multiplexer 102 is received by a first stage latch L1 108 and then received by a second stage latch L2 110. Inverters 112 can be placed between the first stage latch L1 108 and the second stage latch L2 110. The first stage latch L1 108 and the second stage latch L2 110 can be controlled by a clock. The first stage latch L1 108 and the second stage latch L2 110 can be components of a single flop.

After the capture stage, when the SE signal 107 causes the scan chain to switch to the scan stage, the value stored in the second stage latch L2 110 can be output as value 114 to be received by multiplexer 116, which also receives a value of a second memory address YADR<1> 118. When in the scan stage, as discussed below in more detail, all of the values, as captured from the memory addresses and stored in the second level latches L2 110, 122, 134 and 146, are output as an output signal 150.

Specifically, during the scan stage, the first memory address YADR<0> 104, will continue to pass through the entire scan chain and will be output from the second level L2 latch 146 as the output signal 150. The value of the output signal 150 can be compared to a desired (or expected) value. If the values match, then the memory and/or the interface thereto are operating as desired. If the values do not match, then the memory and/or the interface thereto are not operating as desired. This comparison can be done in a testing phase, which can be during the scan stage or after the scan stage. Testing components (not illustrated) can be connected to an output of the scan chain to observe and compare the value output from the second stage latch L2 110 (i.e., the value of the output signal 150, which includes the value output from the second stage latch L2 110 and eventually output from the second stage latch L2 146 during the scan stage) to the correct (or expected) value.

In order to progress through the scan chain during the scan stage, the value of the first memory address YADR<0> 104 is output from the second level L2 latch 110 as value 114, which is received by multiplexer 116. The SE signal 107 allows value 114 to pass through the multiplexer 116, etc. until it reaches the output 150 of the scan chain. The SE signal 107 also switches the output of the multiplexer 116 between outputting the value 114 or the value of the second memory address YADR<1> 118. Further, the output of the multiplexer 116 is received by a first stage latch L1 120 and then received by a second stage latch L2 122. Inverters 124 can be placed between the first stage latch L1 120 and the second stage latch L2 122. The first stage latch L1 120 and the second stage latch L2 122 can be controlled by a clock. The first stage latch L1 120 and the second stage latch L2 122 can be components of a single flop. During the capture stage, the value of the second memory address YADR<1> 118 is eventually stored in the second stage latch L2 122. However, during the scan stage, the value of the second memory address YADR<1> 118 passes through the entire scan chain and is output as part of the output signal 150.

As discussed above regarding the testing of the value of the first memory address YADR<0> 104, if the value of the second memory address YADR<1> 118 (as it is output as part of the output signal 150) matches the desired or expected value, then the memory and the interface thereto are operating as desired. If the value does not match, then the memory and/or the interface thereto are not operating as desired. As described above, this comparison can be done in a testing phase, which can be during the scan stage or after the scan stage. Testing components (not illustrated) can be connected to an output of the second level L2 latch 146 to observe and compare the value output from the second stage latch L2 122 (i.e., the value of the output signal 150, which includes the value output from the second stage latch L2 122 and eventually output from the second stage latch L2 146 during the scan stage) to the correct (or expected) value.

In order to progress through the scan chain during the scan stage, the value of the second memory address YADR<1> 118 is output from the second level L2 latch 122 as value 126, which is received by multiplexer 128. The SE signal 107 allows value 126 to pass from the multiplexer 128, etc. until it reaches the output of the scan chain. The SE signal 107 also switches the output of the multiplexer 128 between outputting the value 126 or the value of the third memory address YADR<2> 130. Further, the output of the multiplexer 128 is received by a first stage latch L1 132 and then received by a second stage latch L2 134. Inverters 136 can be placed between the first stage latch L1 132 and the second stage latch L2 134. The first stage latch L1 132 and the second stage latch L2 134 can be controlled by a clock. The first stage latch L1 132 and the second stage latch L2 134 can be components of a single flop. During the capture stage, the value of the third memory address YADR<2> 130 is eventually stored in the second stage latch L2 134. However, during the scan stage, the value of the third memory address YADR<2> 130 passes through the entire scan chain and is output as part of the output signal 150.

As discussed above regarding the testing of the value of the first memory address YADR<0> 104, if the value of the third memory address YADR<2> 130 (as it is output as part of the output signal 150) matches the desired or expected value, then the memory and the interface thereto are operating as desired. If the value does not match, then the memory and/or the interface thereto are not operating as desired. As described above, this comparison can be done in a testing phase, which can be during the scan stage or after the scan stage. Testing components (not illustrated) can be connected to an output of the second level L2 latch 146 to observe and compare the value output from the second stage latch L2 134 (i.e., the value of the output signal 150, which includes the value output from the second stage latch L2 134 and eventually output from the second stage latch L2 146 during the scan stage) to the correct (or expected) value.

In order to progress through the scan chain during the scan stage, the value of the third memory address YADR<2> 130 is output from the second level L2 latch 134 as value 138, which is received by multiplexer 140. The SE signal 107 allows value 138 to pass from the multiplexer 140 until it reaches the output of the scan chain. The SE signal 107 also switches the output of the multiplexer 140 between outputting the value 138 or the value of the fourth memory address YADR<3> 142. Further, the output of the multiplexer 140 is received by a first stage latch L1 144 and then received by a second stage latch L2 146. Inverters 148 can be placed between the first stage latch L1 144 and the second stage latch L2 146. The first stage latch L1 144 and the second stage latch L2 146 can be controlled by a clock. The first stage latch L1 144 and the second stage latch L2 146 can be components of a single flop. During the capture stage, the value of the fourth memory address YADR<3> 142 is eventually stored in the second stage latch L2 146. However, during the scan stage, the value of the fourth memory address YADR<3> 142 passes through the entire scan chain and is output as part of the output signal 150.

As discussed above regarding the testing of the value of the first memory address YADR<0> 104, if the value of the fourth memory address YADR<3> 142 (as it is output as part of the output signal 150) matches the desired or expected value, then the memory and the interface thereto are operating as desired. If the value does not match, then the memory and/or the interface thereto are not operating as desired. As described above, this comparison can be done in a testing phase, which can be during the scan stage or after the scan stage. Testing components (not illustrated) can be connected to an output of the second level L2 latch 146 to observe and compare the value output from the second stage latch L2 146 (i.e., the value of the output signal 150) to the correct (or expected) value.

After the scan stage, the SE signal 107 causes the multiplexers 102, 116, 128 and 140 to switch back to the capture stage and capture the values of the memory addresses 104, 118, 130 and 142. The structure of the scan chain can continue as described above based on how many memory addresses are to be tested by a single scan chain. In other words, the scan chain can be longer or shorter than the scan chain illustrated in FIG. 1. Further, the entire scan chain can be configured to, in the capture stage, capture all of the values of each of the connected memory addresses in a simultaneous or near simultaneous manner, so that the values of the memory addresses are respectively stored in the second level latches. The scan stage can be implemented to output all of the values of the second level latches as the output signal 150 for testing of the values captured from the memory.

The testing described above can be done using automatic test pattern generation (ATPG) to generate a pattern of values in the memory that provide an expected result. At every clock cycle the system knows expected values. As describe above, the capture stage loads values into each of the first level latches 108, 120, 132 and 144 and each of the second level latches 110, 122, 134 and 146. The values of each of the first level latches 108, 120, 132 and 144 and each of the second level latches 110, 122, 134 and 146 can be output (in a serial format) as the output signal 150 during the scan stage and checked at each clock cycle. This implementation requires the use of many multiplexers which take up valuable space.

The present disclosure implements compression logic (NOR logic, NAND logic or XOR logic) to combine several inputs and capture them into a single flop (or latch). Therefore, a smaller pattern overhead as compared to the above-describe approach can be utilized, because according to the above-described approach, only one input can be brought into the scan chain at a time. As a result, the present disclosure provides a significant savings in logic area, wiring complexity and setup time overhead. The simplification implemented by the present disclosure enables a significant area savings (e.g., up to 10% or more), providing an area advantage over the above-described approach requiring DFT features.

Figure 2:
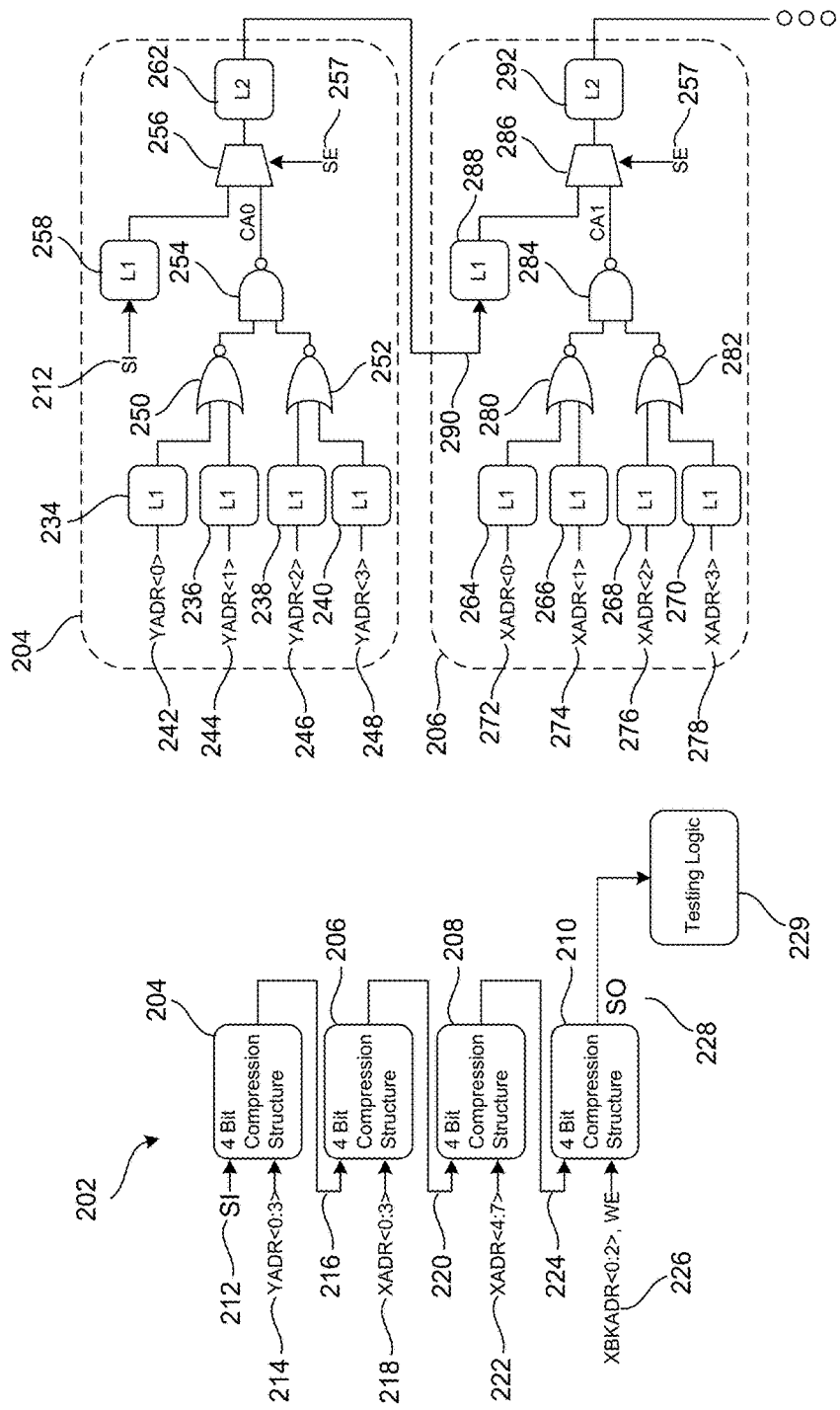
FIG. 2 illustrates a four-bit compression structure, according to an embodiment of the present disclosure.

FIG. 2 illustrates a four-bit compression structure 200, according to an embodiment of the present disclosure. The present disclosure is not limited to a four-bit configuration and can be implemented with a higher number of bits or a lower number of bits. The number of bits represents the number of memory addresses that can be captured for testing by each compression structure. The greater the number of bits in the compressed structure, the greater the area savings. However, as the number of bits increases, so does the complexity of the test pattern, as only one bit in the compressed structure is tested at a time.

FIG. 2 illustrates a high level overview 202 of the four-bit compression structure. As illustrated, a first four-bit compression structure 204 receives an SI signal 212 and values of four memory addresses YADR<0:3> 214. The values of the four memory addresses YADR<0:3> 214 can be simultaneously (or near simultaneously) received. This also applies to receiving values from other memory addresses, as described throughout this disclosure. An output 216 of the first four-bit compression structure 204 is received by a second four-bit compression structure 206 along with values of four memory addresses XADR<0:3> 218. Similarly, an output 220 of the second four-bit compression structure 206 is received by a third four-bit compression structure 208 along with values of four memory addresses XADR<4:7> 222. Similarly, an output 224 of the third four-bit compression structure 208 is received by a fourth four-bit structure 210 along with values of four memory addresses XBKADR<0:2>, WE 226. "WE" represents a write enable control signal. This compression structure is capable of testing the values of any control signal, as well as the values of the addresses of the memory. A scan out (SO) signal 228 is output from the fourth four-bit structure 210. The SO signal 228 is the signal that is output from combination of four-bit compression structures 204, 206, 208 and 210. The values of the SO signal 228 can be compared against desired (or expected) values by testing logic 229. Specifically, the testing logic 229 can compare the values of the SO signal 229 against the desired (or expected) values to determine whether there is a problem with the operation of the memory (e.g., the memory is not storing data correctly or the memory is outputting data incorrectly) and/or with the connectivity of the memory (e.g., the interface of the memory is changing the values of the data output by the memory). As described above, incoming addresses are connected to four-bit compression structures 204, 206, 208 and 210. The four-bit compression structures 204 and 206 are illustrated in more detail on the right hand side of FIG. 2.

In a similar manner as discussed above with reference to FIG. 1, an SE signal 257 is used to switch from the capture stage to the scan stage (e.g., the SE signal 257 can be low to enter the capture stage and the SE signal 257 can be high to enter the scan stage, or visa-versa). During the scan stage, the values captured by each of the first four-bit compression structure 204, the second four-bit compression structure 206, the third four-bit compression structure 208 and the fourth four-bit compression structure 210 are output as the SO signal 228. The SO signal 228 is then compared to desired values for testing the memory and the interface thereto as discussed above.

At a high level, for each four-bit compression structure 204, 206, 208 and 210, incoming addresses from interface pins of the memory being tested connect to first level L1 (primary) latches physically located in the functional (non-DFT) block of the memory being tested. The outputs of the first level L1 latches feed into compression logic (e.g., a NOR structure). A single compressed address output (CA0) connects to a multiplexer 256 that switches between a capture stage of capturing a value output from the compression logic and a scan stage of shifting values according to an SE signal.

Specifically, as illustrated in FIG. 2, the four-bit compression structure 204 includes first level L1 latches 234, 236, 238 and 240. The first level L1 latch 234 receives a value from a first memory address YADR<0> 242, the first level L1 latch 236 receives a value from a second memory address YADR<1> 244, the first level L1 latch 238 receives a value from a third memory address YADR<2> 246 and the first level L1 latch 240 receives a value from a fourth memory address YADR<3> 248. Outputs of each of the first level L1 latches 234, 236, 238 and 240 are connected to four-bit compression logic. FIG. 2 illustrates a specific NOR gate compression logic. Different compression logic structures are discussed in detail below with reference to FIG. 4.

The NOR gate compression logic includes a first NOR gate 250 connected to outputs of the first level L1 latches 234 and 236, and includes a second NOR gate 252 connected to outputs of the first level L1 latches 238 and 240. Outputs of the first NOR gate 250 and the second NOR gate 252 are connected to inputs of a NAND gate 254. The output of the NAND gate 254 is a single compressed address value (e.g., a compressed address output CA0) that is received by a multiplexer 256 that is controlled by the SE signal 257 to select between outputting the single compressed address value and the SI signal 212 stored in a first level L1 latch 258. The output of the multiplexer 256 is received and stored by a second level L2 latch 262.

As discussed above with reference to FIG. 1, the value of the second level L2 latch 262 that is passed through the four-bit compression structures 204, 206, 208 and 210 as the SO signal 228 during the scan stage can be compared (during a testing stage) to a desired (or expected) value to determine whether the memory or the interface to the memory is operating as desired. Specifically, the SE signal 257 allows the SI signal 212 to pass to the second level L2 latch 262, the four-bit compression structure 204 enters the scan stage (after the capture stage) and an output of the second level L2 latch 262 is provided to the four-bit compression structure 206 and is eventually output as the SO signal 228. When the four-bit compression structure 204 enters the scan stage, the other four-bit compression structures 206, 208 and 210 will also enter the scan stage, as they also receive the SE signal 257.

In order to test the value of the first memory address YADR<0> 242 in the capture and testing stages, the values of the second memory address YADR<1> 244, the third memory address YADR<2> 246 and the fourth memory address YADR<3> 248 can be held low (i.e., held to a value of 0). In this scenario, the value of CA0 will match the value of the first memory address YADR<0> 242 as received by the first level L1 latch 234. As a result, during the capture stage to capture the value of the first memory address YADR<0> 242, the SE signal 257 controls the multiplexer 256 to output the CA0 value to the second level L2 latch 262. Specifically, during the scan stage, the SE signal 257 controls the multiplexer 256 to output the CA0 value through the scan chain as the SO signal 228, followed by the SI signal 212. As the CA0 signal is output (as the SO signal 228) the testing stage can begin comparing the CA0 signal against desired values to determine whether the memory and the memory interface are operating as desired.

The testing of the other memory addresses can be carried out in the same manner Specifically, when testing the value of the second memory address YADR<1> 244, the values of the first memory address YADR<0> 242, the third memory address YADR<2> 246 and the fourth memory address YADR<3> 248 can be held low (i.e., held to a value of 0). As discussed above, the value of CA0 will match the value of the second memory address YADR<1> 244 that is in the first level L1 latch 236. The same implementation can be carried out for testing the value of the third memory address YADR<2> 246 by having the values of the first, second and fourth memory addresses 242, 244 and 248 set to low and for testing the value of the fourth memory address YADR<3> 248 by having the values of the first, second and third memory addresses 242, 244 and 246 be set to low.

The four-bit compression structure 206 has a similar structure as the four-bit compression structure 204, except that the four-bit compression structure 206 receives a value 290 output from the second level L2 latch 262 of the four-bit compression structure 204, as opposed to directly receiving the SI signal 212 as does the four-bit compression structure 204. Specifically, the four-bit compression structure 206 includes first level L1 latches 264, 266, 268 and 270 which respectively receive a value of a fifth memory address XADR<0> 272, a value of a sixth memory address XADR<1> 274, a value of a seventh memory address XADR<2> 276 and a value of an eighth memory address XADR<3> 278.

Additionally, the four-bit compression structure 206 includes NOR compression logic including a NOR gate 280 and a NOR gate 282, wherein the NOR gates 280 and 282 receive the values stored by the first level L1 latches 264, 266, 268 and 270. Outputs from the NOR gates 280 and 280 are received by a NAND gate 284, which outputs a single compressed address value CA1 to a multiplexer 286. The multiplexer 286 also receives the value 290 that is output from the second level L2 latch 262 of the four-bit compression structure 204 and stored in a first level L1 latch 288. The multiplexer 286 receives the SE signal 257 that selects between outputting the single compressed address value CA1 and the value 290 to a second level L2 latch 292. The operation of the four-bit compression structure 206 is the same as that described above with respect to the four-bit compression structure 204. Therefore, redundant descriptions thereof are omitted.

Compared to the approach illustrated in FIG. 1, the benefits of the present disclosure, as describe with respect to FIG. 2, include (i) significant area reduction, (ii) setup time improvement and (iii) elimination of wiring complexity. Regarding the area reduction, the number of multiplexers is reduced, for each compression structure, from four to one, the number of inverter-equivalent logic gates is reduced, for each compression structure, from 8 to 6 and the number of level two L2 latches reduced, for each compression structure, from four to one, in one embodiment. Regarding the setup time improvement, external address/control pins can connect directly to the functional first level L1 latches, which can remove multiplexer logic and wiring between the memory being tested and the first level L1 latches.

Figure 3:
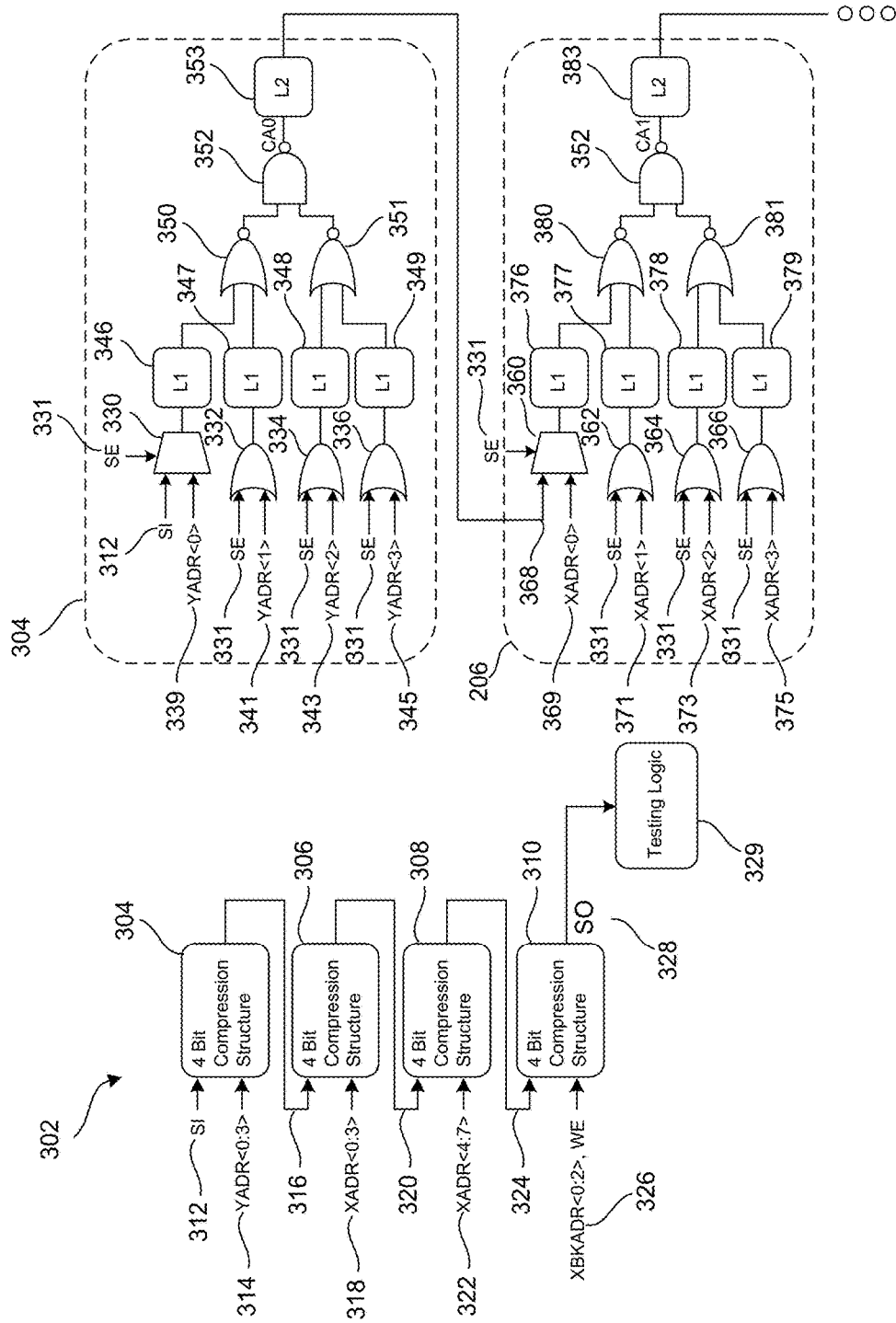
FIG. 3 illustrates a four-bit compression structure, according to an embodiment of the present disclosure.

FIG. 3 is similar to FIG. 2, and illustrates a four-bit compression logic structure 300, according to an embodiment of the present disclosure. FIG. 3 illustrates a four-bit compression structure that includes one second level L2 latch, which can be used to form an L1/L2 (primary/secondary) flop combination. One of the first level L1 latches connects to a multiplexer that selects between the capture stage and a scan stage. Other first level L1 latches connect to OR gates.

Specifically, FIG. 3 illustrates, in a similar manner as FIG. 2, a high level overview 302 of the four-bit compression structure. As illustrated, a first four-bit compression structure 304 receives an SI signal 312 and values of four memory addresses YADR<0:3> 314. An output 316 of the first four-bit compression structure 304 is received by a second four-bit compression structure 306 along with values of four memory addresses XADR<0:3> 318. Similarly, an output 320 of the second four-bit compression structure 306 is received by a third four-bit compression structure 308 along with values of four memory addresses XADR<4:7> 322. Similarly, an output 324 of the third four-bit compression structure 308 is received by a fourth four-bit structure 310 along with values of four memory addresses XBKADR<0:2> and WE 326. An SO signal 328 is output from the fourth four-bit structure 310. As described above, incoming values from memory addresses are connected to four-bit compression structures 304, 306, 308 and 230. The four-bit compression structures 304 and 306 are illustrated in more detail on the right hand side of FIG. 3.

At a high level, for each four-bit compression structure 304, 306, 308 and 310, incoming values from memory addresses are received from interface pins (of the memory being tested) connect a multiplexer and OR gates that connect to first level L1 (primary) latches physically located in the functional (non-DFT) block of the memory being tested. This embodiment is different than the embodiment of FIG. 2, in that a multiplexer 330 is provided between a first memory address YADR<0> 339 and a first level L1 latch 346, an OR gate 332 is provided between a second memory address YADR<1> 341 and a first level L1 latch 347, an OR gate 334 is provided between a third memory address YADR<2> 343 and a first level L1 latch 348, and an OR gate 336 is provided between a fourth memory address YADR<3> 345 and a first level L1 latch 349. The outputs of the first level L1 latches 346, 347, 348 and 349 feed into compression structure logic (e.g., a NOR structure). A single compressed address output (CA0) is provided from the compression structure logic to a second level L2 latch 353.

Specifically, as illustrated in FIG. 3, the four-bit compression structure 304 includes the multiplexer 330 that receives an SE signal 331, which is a scan enable signal to trigger switching from the capture stage to the scan stage, wherein the SE signal 331 can be low to enter the capture stage and the SE signal 331 can be high to enter the scan stage. The multiplexer 330 can also receive the SI signal 312 that is output from the multiplexer 330 when the SE signal 331 is enabled (e.g., high) to select the SI signal 312, and receives a value from the first memory address YADR<0> 339. The output of the multiplexer 330 is provided to the first level L1 latch 346. Further, the four-bit compression structure 304 includes the OR gate 332 that receives the SE signal 331 and a value of the second memory address YADR<1> 341. The output of the OR gate 332 is provided to the first level L1 latch 347.

Additionally, the four-bit compression structure 304 includes the OR gate 334 that receives the SE signal 331 and a value of the third memory address YADR<2> 343. The output of the OR gate 334 is provided to the first level L1 latch 348. The four-bit compression structure also includes the NOR gate 336 that receives the SE signal 331 and a value of the fourth memory address YADR<3> 345. The output of the OR gate 336 is provided to the first level L1 latch 349. Outputs of each of the first level L1 latches 346, 347, 348 and 349 are connected to compression logic. FIG. 3 illustrates a specific NOR gate compression logic. Different compression logic structures are discussed in detail below with reference to FIG. 4.

The NOR gate compression logic includes a first NOR gate 350 connected to outputs of the first level L1 latches 346 and 347, and includes a second NOR gate 351 connected to outputs of the first level L1 latches 348 and 349. Outputs of the first NOR gate 350 and the second NOR gate 351 are connected to inputs of a NAND gate 352. The output of the NAND gate 352 is a single compressed address value (e.g., a compressed address output CA0) that is received the second level L2 latch 353. As discussed above, the multiplexer 330 is controlled by the SE signal 331 to select between outputting the single compressed address value and the SI signal 212.

For example, when capturing the value of the first memory address YADR<0> 339, which can be 0 or 1, the SE signal 331 will have a value of 0, the SI signal 312 can have a value of 0 or 1, and the values of the second memory address YADR<1> 341, the third memory address YADR<2> 343 and the fourth memory address YADR<3> 345 will be 0. Accordingly, the value of CA0 will match the value of the first memory address YADR<0> 339. Similar to FIG. 2, as discussed above, when capturing the value of the second memory address YADR<1> 341, the values of the first memory address YADR<0> 339, the third memory address YADR<2> 343 and the fourth memory address YADR<3> 345 will be 0, and so on for capturing the value of the other memory addresses. The four-bit compression structure 304 can switch to the scan stage by setting the value of the SE signal to 1, so that the value CA0 is eventually output as the SO signal 328 during the scan stage.

As discussed above with reference to FIGS. 1 and 2, the values of the SO signal 328, during a testing stage, can be compared to a desired (or expected) values by testing logic 329. Specifically, the testing logic 329 can compare the values of the SO signal 328 against the desired (or expected) values to determine whether the memory and the interface to the memory are operating as desired.

The four-bit compression structure 306 has a similar structure as the four-bit compression structure 304, except that a multiplexer 360 of the four-bit compression structure 306 receives an output 368 of the second level L2 latch 353 of the four-bit compression structure 304, as opposed to directly receiving the SI signal 312 as does the four-bit compression structure 304. Specifically, in a similar manner as the four-bit compression structure 304, the four-bit compression structure 306 includes the multiplexer 360, an OR gate 362, an OR gate 364 and an OR gate 366 that respectively receive a value of a fifth memory address XADR<0> 369, a value of a sixth memory address XADR<1> 371, a value of a seventh memory address XADR<2> 373 and a value of an eight memory address XADR<3> 375. Each of the OR gates 362, 364 and 366 also receives the SE signal 331. The output of the multiplexer 360 is provided to a first level L1 latch 376, the output of the OR gate 362 is provided to a first level L1 latch 377, the output of the OR gate 364 is provided to a first level L1 latch 378 and the output of the OR gate 366 is provided to a first level L1 tach 379.

Additionally, the four-bit compression instruction includes NOR compression logic including a NOR gate 380 and a NOR gate 381, wherein the NOR gates 380 and 381 receive the values stored by the first level L1 latches 376, 377, 378 and 379. Outputs from the NOR gates 380 and 381 are received by a NAND gate 382, which outputs a single compressed address value CA1 to a second level L2 latch 383. The operation of the four-bit compression structure 306 is the same as that described above with respect to the four-bit compression structure 304. Therefore, redundant descriptions thereof are omitted.

In this embodiment of FIG. 3 (in comparison to FIG. 1), for each compression structure, the number of level two L2 latches is reduced from four to one.

Figure 4:
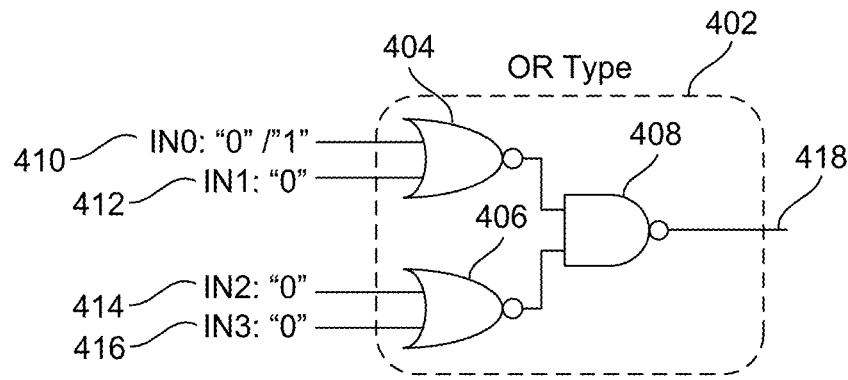
FIG. 4 illustrates three different structures for compression logic, according to various embodiments of the present disclosure.
Figure 4:
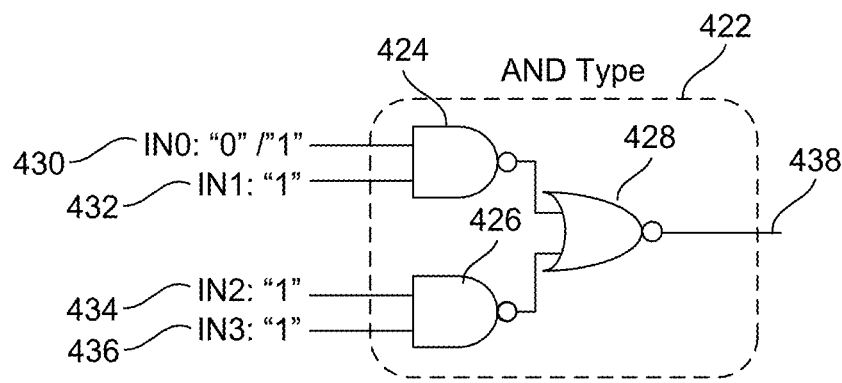
Figure 4:
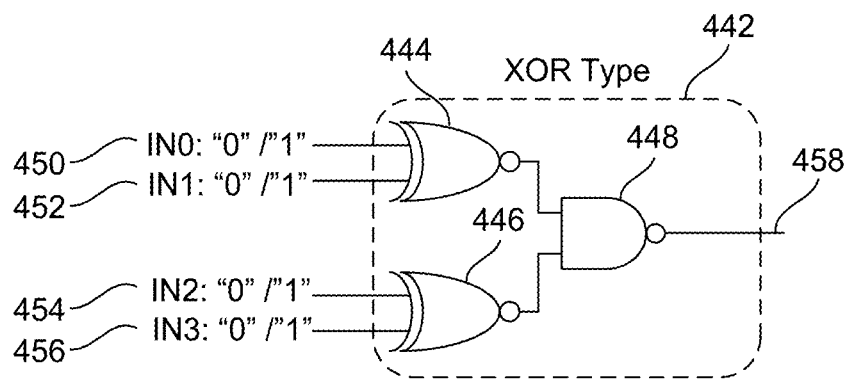

FIG. 4 illustrates three different structures for compression logic, according to various embodiments of the present disclosure. The three different structures include (i) OR type compression logic 402, (ii) AND type compression logic 422 and (iii) XOR type compression logic 442. The OR type compression logic 402 of FIG. 4 is the same compression logic illustrated in FIG. 2 (i.e., NOR gates 250 and 252 and NAND gate 254) as well as that illustrated in FIG. 3 (i.e., NOR gates 350 and 351 and NAND gate 352). The AND type compression logic 422 of FIG. 4 and the XOR type compression logic 442 of FIG. 4 can replace the OR type compression logic of FIGS. 2 and 3.

The OR type compression logic 402 includes a NOR gate 404, a NOR gate 406 and a NAND gate 408 connected to outputs of the NOR gates 404 and 406. As illustrated, the NOR gate 404 receives an IN0 signal 410 that is a signal being tested. The NOR gate 404 also receives an IN1 signal 412, which is not a signal that is being tested. The value of the IN1 signal 412 is held low (i.e., held to 0), while the IN0 signal 410 is being tested. Similarly, the NOR gate 406 receives both an IN2 signal 414 and an IN3 signal 416. Again, because the IN0 signal 410 is the signal that is being tested, both the IN2 signal 414 and the IN3 signal 416 are held low (i.e., held to 0). An output signal 418 of the OR type compression logic 402 should match the value of the IN0 signal 410 (when the IN0 signal 410 is the signal being tested). In other words, the output signal 418 reflects the input signal under test. Any faults from the interconnectivity between a source of the IN0-IN3 signals 410, 412, 414 and 416 and the memory interface can be detected with the compression logic.

The AND type compression logic 422 includes a NAND gate 424, a NAND gate 426 and a NOR gate 428 connected to outputs of the NAND gates 424 and 426. As illustrated, the NAND gate 424 receives an IN0 signal 430 that is a signal being tested. The NAND gate 424 also receives an IN1 signal 432, which is not a signal that is being tested. The value of the IN1 signal 432 is held high (i.e., held to 1), while the IN0 signal 430 is being tested. Similarly, the NAND gate 426 receives both an IN2 signal 434 and an IN3 signal 436. Again, because the IN0 signal 430 is the signal that is being tested, both the IN2 signal 434 and the IN3 signal 436 are held high (i.e., held to 1). An output signal 438 of the AND type compression logic 422 should match the value of the IN0 signal 430 (when the IN0 signal 430 is the signal being tested). In other words, the output signal 438 reflects the input signal under test. Any faults from the interconnectivity between a source of the IN0-IN3 signals 430, 432, 434 and 436 and the memory interface can be detected with the compression logic.

The XOR type compression logic 442 includes an XOR gate 444, an XOR gate 446 and a NAND gate 448 connected to outputs of the XOR gates 444 and 446. As illustrated, the XOR gate 444 receives an IN0 signal 450 and an IN1 signal 452. Similarly, the XOR gate 446 receives an IN2 signal 454 and an IN3 signal 456. Outputs of the XOR gates 444 and 446 are provided to the NAND gate 448. Using the XOR type compression logic 442, the IN0 signal 450, the IN1 signal 452, the IN2 signal 454 and the IN3 signal 456 can be tested simultaneously. Using this XOR type compression logic 442, the logic tree allows for simultaneous testing because a desired test pattern provided on the IN0 signal 450, the IN1 signal 452, the IN2 signal 454 and the IN3 signal 456 will produce a desired result. An output signal 458 is output by the NAND gate 448 that receives the outputs from the XOR gates 444 and 446. The number of test sequences can be reduced compared to the OR type compression logic 402 and the AND type compression logic 422, but area occupied by this implementation is larger.

Figure 5:
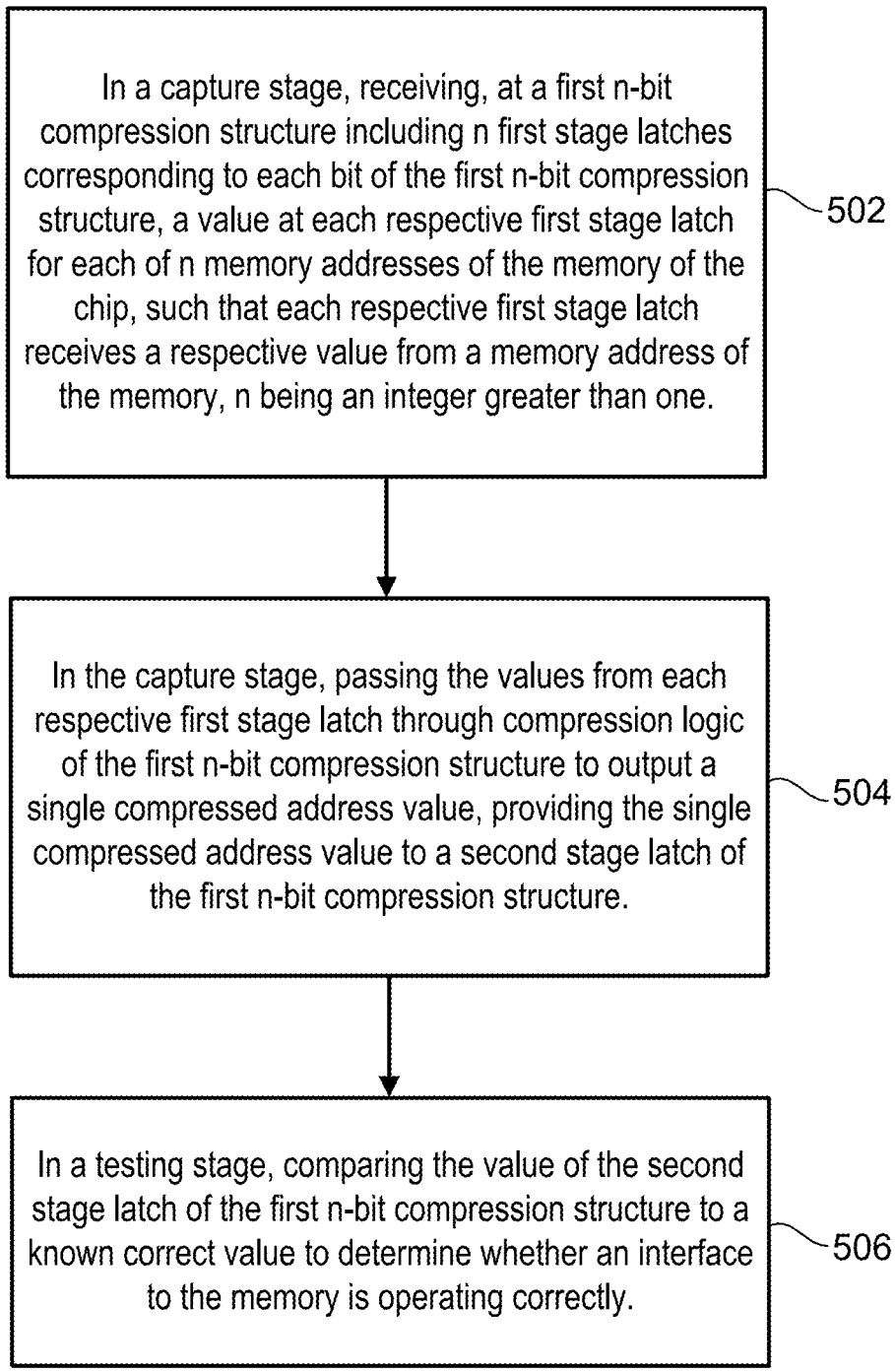
FIG. 5 illustrates various operations for testing a memory of a chip, according to an embodiment of the present disclosure.

FIG. 5 illustrates various operations 500 for testing a memory of a chip according to an embodiment of the present disclosure. Specifically, the operations 500 of FIG. 5 include an operation 502 that, in a capture stage, receives, at a first n-bit compression structure including n first stage latches corresponding to each bit of the first n-bit compression structure, a value at each respective first stage latch for each of n memory addresses of the memory of the chip, such that each respective first stage latch receives a respective value from a memory address of the memory, n being an integer greater than one.

Further, the operations 500 of FIG. 5 include an operation 504 that, in the capture stage, passes the values from each respective first stage latch through compression logic of the first n-bit compression structure to output a single compressed address value, providing the single compressed address value to a second stage latch of the first n-bit compression structure.

The operations of FIG. 5 also include an operation 506 that, in a testing stage, compares the value of the second stage latch of the first n-bit compression structure to a desired value to determine whether the memory or an interface to the memory is operating as desired.

Figure 6:
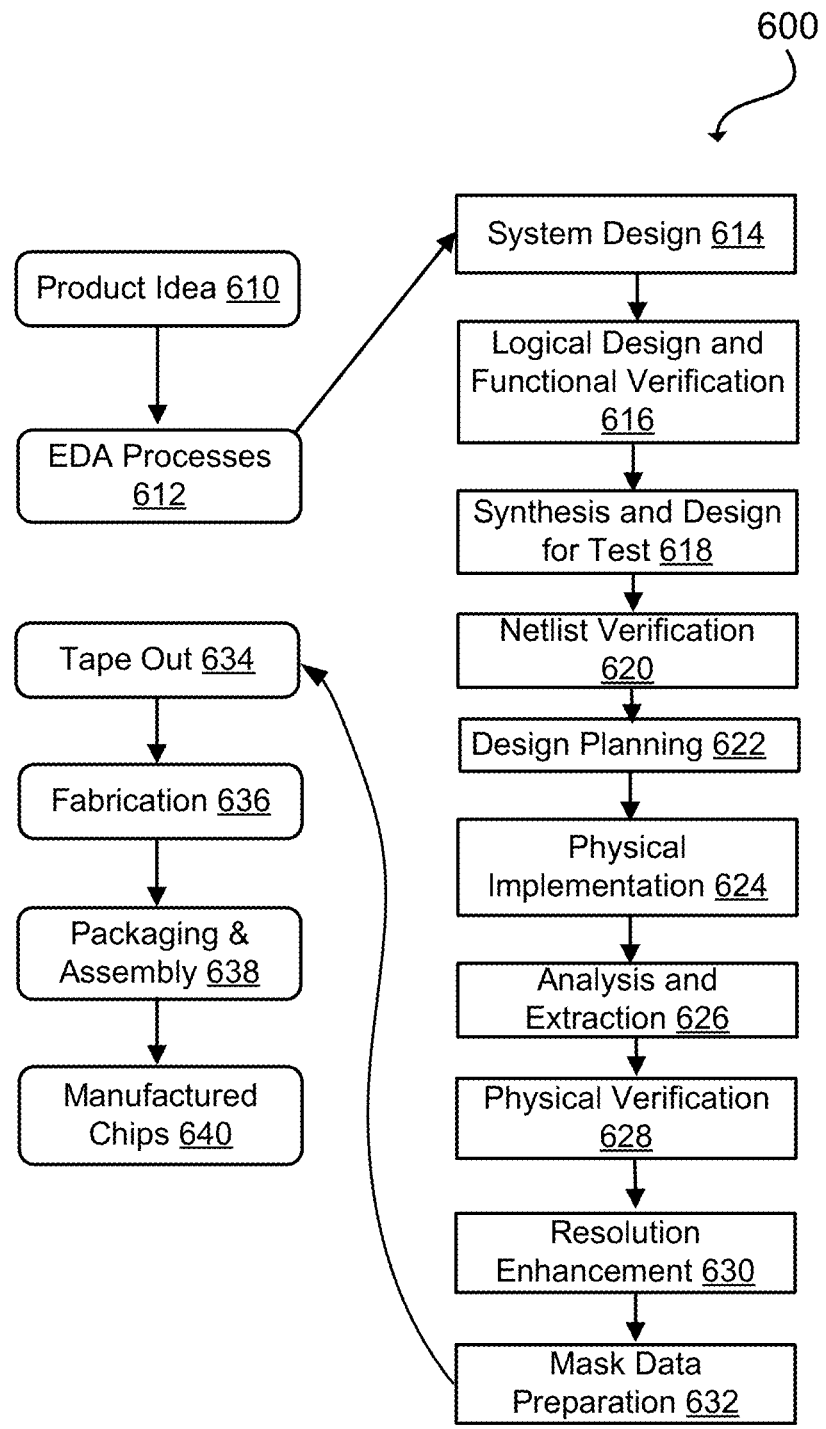
FIG. 6 depicts a flowchart of various processes used during the design and manufacture of an integrated circuit in accordance with some embodiments of the present disclosure.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 6. The processes described by be enabled by EDA products (or EDA systems).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
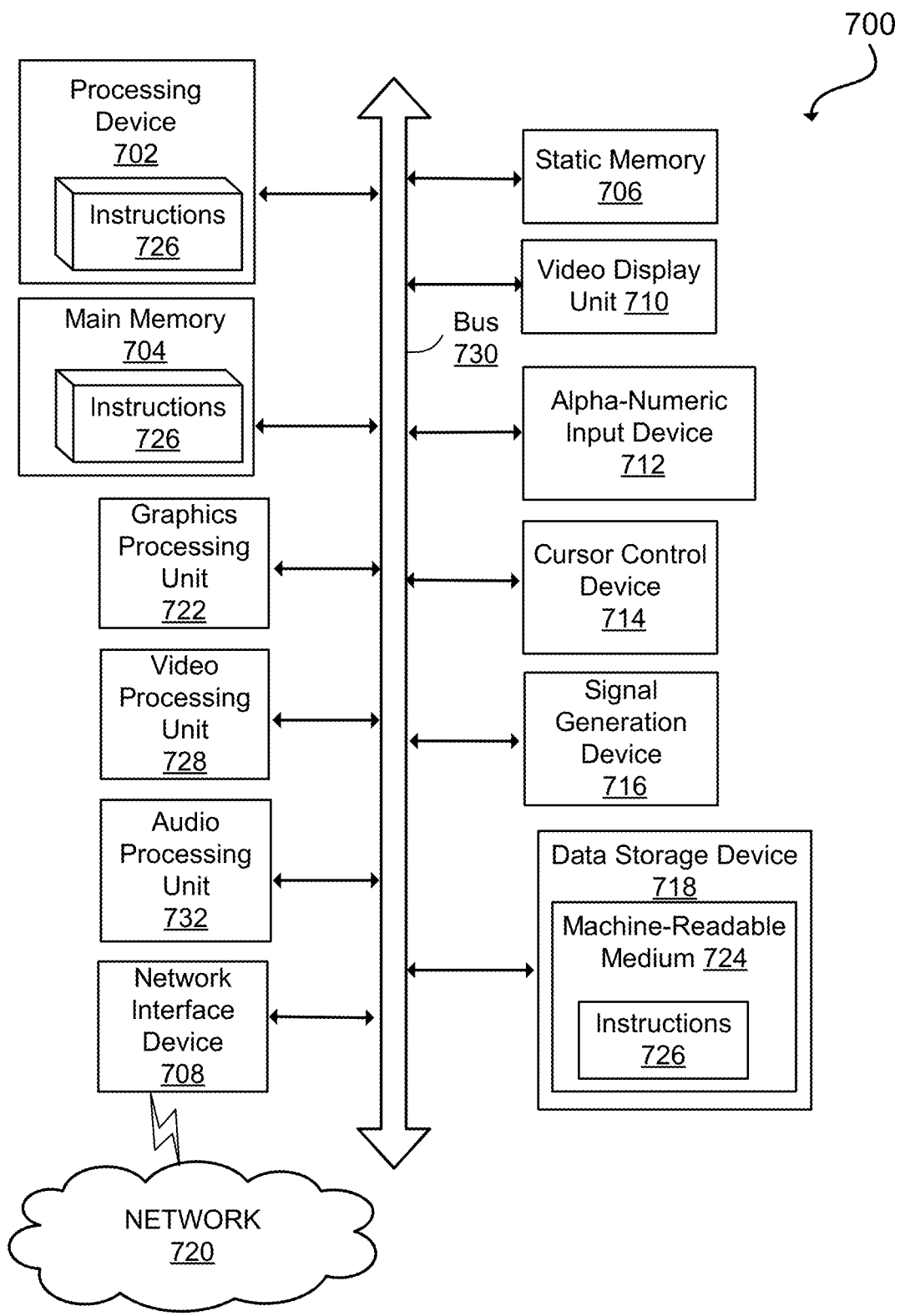
FIG. 7 depicts a diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of using on-chip circuitry to test a memory of a chip, the method comprising:
   in a capture stage, receiving, at a first n-bit compression structure including n first stage latches corresponding to each bit of the first n-bit compression structure, a value at each respective first stage latch for each of n memory addresses of the memory of the chip, such that each respective first stage latch receives a respective value from a memory address of the memory, n being an integer greater than one;
   in the capture stage, passing the values from each respective first stage latch through compression logic of the first n-bit compression structure to output a single compressed address value, and providing the single compressed address value to a second stage latch of the first n-bit compression structure; and
   in a testing stage, comparing the single compressed address value of the second stage latch of the first n-bit compression structure, as output from the first n-bit compression structure, to a desired value to determine whether an interface to the memory is operating as desired.

2. The method of claim 1, wherein n has a value of four.

3. The method of claim 2, further comprising:
   in the capture stage for capturing a value of a particular latch of the four first stage latches, setting values of the remaining three latches of the four first stage latches to 0, such that an output of a NAND gate of the four-bit compression structure, which is the single compressed address value, matches the value of the particular latch, the particular latch being connected to a particular memory address of the memory; and
   in the testing stage for testing an interface to the particular memory address of the memory, comparing the value of the second stage latch of the four-bit compression structure, as output from the four-bit compression structure, to a known correct value of the particular memory address to determine whether the interface to the particular memory address is operating as desired.

4. The method of claim 2, further comprising:
   in the capture stage, passing the single compressed address value from a first multiplexer to the second stage latch;
   switching from the capture stage to a scan stage based on another input into the first multiplexer; and
   after switching from the capture stage to the scan stage passing a value received on the other input into the first multiplexer to the second stage latch.

5. The method of claim 4, further comprising, after switching from the capture stage to the scan stage, passing the previously stored single compressed address value from the second stage latch to a latch of a second four-bit compression structure.

6. The method of claim 4, further comprising switching from the capture stage to the scan stage in dependence upon a scan enable (SE) signal of the chip.

7. The method of claim 2, further comprising:
in the capture stage for capturing a value of a particular latch of the four first stage latches, setting values of the remaining three latches of the four first stage latches to 1, such that an output of a NOR gate of the four-bit compression structure, which is the single compressed address value, matches the value of the particular latch, the particular latch being connected to a particular memory address of the memory; and
in the testing stage for testing an interface to the particular memory address of the memory, comparing the value of the second stage latch of the four-bit compression structure, as output from the four-bit compression structure, to a known correct value of the particular memory address to determine whether the interface to the particular memory address is operating as desired.

8. The method of claim 1, further comprising:
in a scan stage, passing the value of the second stage latch of the first n-bit compression structure to a latch of a second n-bit compression structure; and
in the capture stage, receiving, at the second n-bit compression structure including n first stage latches corresponding to each bit of the second n-bit compression structure, a value at each respective first stage latch for each of n memory addresses of the memory, such that each respective first stage latch, of the second n-bit compression structure, receives a respective value from a memory address of the memory, n being an integer greater than one.

9. The method of claim 8, further comprising, in the testing stage, comparing the value of the second stage latch of the second n-bit compression structure, as output from the second n-bit compression structure, to a desired value to determine whether the memory is operating as desired.

10. A system for testing a memory of a chip, the system comprising:
a first n-bit compression structure including n first stage latches corresponding to each bit of the first n-bit compression structure, the first n-bit compression structure being configured to receive, in a capture stage, a value at each respective first stage latch for each of n memory addresses of the memory, such that each respective first stage latch receives a respective value from a memory address of the memory, n being an integer greater than one,
wherein the first n-bit compression structure further includes compression logic and a second stage latch, such that, in the capture stage, the values are passed from each respective first stage latch through the compression logic to output a single compressed address value and the single compressed address value is provided to the second stage latch.

11. The system of claim 10, further comprising testing logic configured to, in a testing stage, compare the value of the second stage latch of the first n-bit compression structure, as output from the first n-bit compression structure, to a value to determine whether an interface to the memory is operating as desired.

12. The system of claim 11, wherein n has a value of four.

13. The system of claim 12,
wherein the four-bit compression structure includes:
a first NOR gate connected to outputs of a first two of the four first stage latches and configured to, in the capture stage, receive values from a first two of four first stage latches as inputs;
a second NOR gate connected to outputs of a second two of the four first stage latches and configured to, in the capture stage, receive values from a second two of the four first stage latches as inputs;
a NAND gate having inputs connected to outputs of the first and second NOR gates and configured to, in the capture stage, receive an output of the first and second NOR gates as the single compressed value; and
a first multiplexer connected to an output of the NAND gate and configured to receive the output of the NAND gate.

14. The system of claim 12,
wherein the four-bit compression structure includes:
a first NAND gate connected to outputs of a first two of four first stage latches and configured to, in the capture stage, receive values from the first two of the four first stage latches as inputs;
a second NAND gate connected to outputs of a second two of the four first stage latches and configured to, in the capture stage, receive values from the second two of the four first stage latches as inputs;
a NOR gate having inputs connected to outputs of the first and second NAND gates and configured to, in the capture stage, receive values output from the first and second NAND gates as the single compressed address value; and
a first multiplexer connected to an output of the NOR gate and configured to receive the single compressed address value output from the NOR gate.

15. The system of claim 12,
wherein the four-bit compression structure includes:
a first XOR gate connected to outputs of a first two of four first stage latches and configured to, in the capture stage, receive values from the first two of the four first stage latches as inputs;
a second XOR gate connected to outputs of a second two of the four first stage latches and configured to, in the capture stage, receive values from the second two of the four first stage latches as inputs;
a NAND gate having inputs connected to outputs of the first and second XOR gates and configured to, in the capture stage, receive values output from the first and second XOR gates as the single compressed address value; and
a first multiplexer connected to an output of the XOR gate and configured to receive the single compressed address value output from the XOR gate.

16. The system of claim 12,
wherein the four-bit compression structure includes:
a first multiplexer connected to a first latch of four first stage latches, the first multiplexer receiving (i) a first input as a scan in (SI) signal, (ii) a second input as a value of a first memory address of the memory and (iii) a third input as a scan enable (SE) signal that dictates whether the first four-bit compression structure is in the capture stage or the scan stage;
a first OR gate connected to a second latch of the four first stage latches, the first OR gate receiving (i) a first input as the SE signal that controls operation of the first multiplexer and (ii) a second input as a value of a second memory address of the memory;

a second OR gate connected to a third latch of the four first stage latches, the second OR gate receiving (i) a first input as the SE signal that controls the operation of the first multiplexer and (ii) a second input as a value of a third memory address of the memory; and a third OR gate connected to a fourth latch of the four first stage latches, the third OR gate receiving (i) a first input as the SE signal that controls operation of the first multiplexer and (ii) a second input as a value of a fourth memory address of the memory.

17. The system of claim 16,
wherein the four-bit compression structure includes:
   a fourth NOR gate connected to outputs of a first two of the four first stage latches and configured to, in the capture stage, receive values from the first two of the four first stage latches as inputs;
   a fifth NOR gate connected to outputs of a second two of the four first stage latches and configured to, in the capture stage, receive values from the second two of the four first stage latches as inputs; and
   a NAND gate having inputs connected to outputs of the fourth and fifth NOR gates and configured to, in the capture stage, receive an output from the fourth and fifth NOR gates as the single compressed address value and pass the single compressed address value to the second stage latch.

18. The system of claim 16,
wherein the four-bit compression structure includes:
   a first NAND gate connected to outputs of a first two of the four first stage latches and configured to, in the capture stage, receive values from the first two of the four first stage latches as inputs;
   a second NAND gate connected to outputs of a second two of the four first stage latches and configured to, in the capture stage, receive values from the second two of the four first stage latches; and
   a fourth NOR gate having inputs connected to outputs of the first and second NAND gates and configured to, in the capture stage, receive an output from the first and second NAND gates as the single compressed address value and pass the single compressed address value to the second stage latch.

19. The system of claim 16,
wherein the four-bit compression structure includes:
   a first XOR gate connected to outputs of a first two of the four first stage latches and configured to, in the capture stage, receive values from the first two of the four first stage latches as inputs;
   a second XOR gate connected to outputs of a second two of the four first stage latches and configured to, in the capture stage, receive values from the second two of the four first stage latches; and
   a NAND gate having inputs connected to outputs of the first and second XOR gates and configured to, in the capture stage, receive an output from the first and second XOR gates as the single compressed address value and pass the single compressed address value to the second stage latch.

20. A non-transitory computer readable medium comprising stored instructions for testing a memory of a chip, the instructions, when executed by a processor, causing the processor to:
   in a capture stage, receiving, at a first n-bit compression structure including n first stage latches corresponding to each bit of the first n-bit compression structure, a value at each respective first stage latch for each of n memory addresses of the memory, such that each respective first stage latch receives a respective value from a memory address of the memory, n being an integer greater than one; and
   in the capture stage, passing the values from each respective first stage latch through compression logic of the first n-bit compression structure to output a single compressed address value, providing the single compressed address value to a second stage latch of the first n-bit compression structure.

* * * * *